(12) United States Patent
Hu et al.

(10) Patent No.: US 11,101,287 B2
(45) Date of Patent: Aug. 24, 2021

(54) THREE DIMENSIONAL MEMORY DEVICE

(71) Applicant: MACRONIX INTERNATIONAL CO., LTD., Hsinchu (TW)

(72) Inventors: Chih-Wei Hu, Toufen (TW); Teng-Hao Yeh, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 67 days.

(21) Appl. No.: 16/693,507

(22) Filed: Nov. 25, 2019

(65) Prior Publication Data
US 2021/0159243 A1    May 27, 2021

(51) Int. Cl.
*H01L 27/11582*    (2017.01)
*H01L 27/11565*    (2017.01)

(52) U.S. Cl.
CPC .. *H01L 27/11582* (2013.01); *H01L 27/11565* (2013.01)

(58) Field of Classification Search
CPC ............... H01L 27/11582; H01L 27/11565
See application file for complete search history.

(56) References Cited

U.S. PATENT DOCUMENTS

| | | | |
|---|---|---|---|
| 2017/0263637 A1* | 9/2017 | Sakata | H01L 29/40117 |
| 2018/0033794 A1* | 2/2018 | Baraskar | H01L 27/11565 |
| 2018/0337192 A1* | 11/2018 | Kim | H01L 27/11565 |
| 2020/0013800 A1* | 1/2020 | Or-Bach | H01L 27/2481 |
| 2020/0091187 A1* | 3/2020 | Lee | H01L 27/11582 |

* cited by examiner

*Primary Examiner* — Fernando L Toledo
*Assistant Examiner* — Neil R Prasad
(74) *Attorney, Agent, or Firm* — McClure, Qualey & Rodack, LLP

(57) ABSTRACT

A three-dimensional memory device includes a plurality of conductive layers and insulating layers alternately formed to define a multi-layer stacked structure. The multi-layer stacked structure includes a stair region and an non-stair region, the stair region includes a plurality of steps, each step includes an immediately-adjacent pair of the conductive layers and insulating layers. A plurality of memory structures are located in the non-stair region, and each memory structure passes through the conductive layers and the insulating layers. A fishbone dielectric structure includes a main bone and a plurality of side bones extending from the main bone in the stair region, wherein the main bone crosses the memory structures in the non-stair region.

19 Claims, 15 Drawing Sheets

THREE DIMENSIONAL MEMORY DEVICE

BACKGROUND

Field of Invention

The present disclosure relates to a memory device and method for fabricating the same, and more particularly to a high-density three dimensional memory device and method for fabricating the same.

Description of Related Art

Memory devices are important device to a portable electric apparatus, such as a MP3 displayer, a digital camera, a notebook, a cell phone . . . and so on, for data storage. As the increasing applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device without deteriorate its operation performance have become a challenge to the persons skilled in the art. Therefore, there is a need of providing an improved 3D memory device and the method for fabricating the same to obviate the drawbacks encountered from the prior art.

SUMMARY

One aspect of the present disclosure is to provide a three-dimensional memory device including a plurality of conductive layers and insulating layers alternately formed to define a multi-layer stacked structure, wherein the multi-layer stacked structure includes a stair region and an non-stair region, the stair region includes a plurality of steps, each step includes an immediately-adjacent pair of the conductive layers and insulating layers; a plurality of memory structures located in the non-stair region and each memory structure passing through the conductive layers and the insulating layers; and a fishbone dielectric structure includes a main bone and a plurality of side bones extending from the main bone in the stair region, wherein the main bone crosses the memory structures in the non-stair region.

Another aspect of the present disclosure is to provide a three-dimensional memory device including a plurality of conductive layers and insulating layers alternately formed to define a multi-layer stacked structure, wherein the multi-layer stacked structure includes a stair region and an non-stair region, the stair region includes a plurality of steps, each step includes an immediately-adjacent pair of the conductive layers and insulating layers; a plurality of memory structures located in the non-stair region and each memory structure passing through the conductive layers and the insulating layers; and at least one dielectric post located in each step of the stair region, wherein the at least one dielectric post is a dielectric post without electrically-conductive materials.

In one or more embodiments, the fishbone dielectric structure is a dielectric structure without electrically-conductive materials.

In one or more embodiments, each side bone extends along a sidewall of a corresponding step of the stair region.

In one or more embodiments, each side bone is in contact with a sidewall of a corresponding step of the stair region.

In one or more embodiments, a plurality of metal posts are formed in contact with the steps of the stair region, an immediately-adjacent pair of the metal posts are spaced from each other by a corresponding one of the side bones.

In one or more embodiments, a plurality of metal posts are formed in contact with the steps of the stair region, an immediately-adjacent pair of the metal posts are spaced from each other by the main bone.

In one or more embodiments, each side bone extends perpendicularly from the main bone.

In one or more embodiments, the fishbone dielectric structure includes an oxide material.

In one or more embodiments, the conductive layers include tungsten and the insulating layers include silicon oxide.

In one or more embodiments, an immediately-adjacent pair of the side bones extends from two opposite sides of the main bone.

In one or more embodiments, the memory structures crossed by the main bone form hemi-cylindrical memory devices.

In one or more embodiments, the side bones symmetrically extending from the main bone in the stair region.

In one or more embodiments, a plurality of metal posts are formed in contact with the steps of the stair region, the at least one dielectric post is located between an immediately-adjacent pair of the metal posts.

In one or more embodiments, a plurality of metal posts are formed in contact with the steps of the stair region, each metal post is located in a central region of each step.

In one or more embodiments, the at least one dielectric post includes an oxide material.

In one or more embodiments, the at least one dielectric post is in contact with a sidewall of each step.

In one or more embodiments, each of the memory structures includes gate-all-around transistors.

In one or more embodiments, a passivation layer is covered over the stair region.

In sum, a three-dimensional semiconductor memory device includes dielectric posts or fishbone dielectric structures in the stair regions. The dielectric posts or fishbone dielectric structures are configured to serve as support structures to retain the remaining insulating layers such that the insulating layers would not collapse due to the voids therebetween. The dielectric posts or fishbone dielectric structures are also located between metal posts or contacts in the stair regions to avoid bridging in cases of overlap shift occurred in metal posts or contacts.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
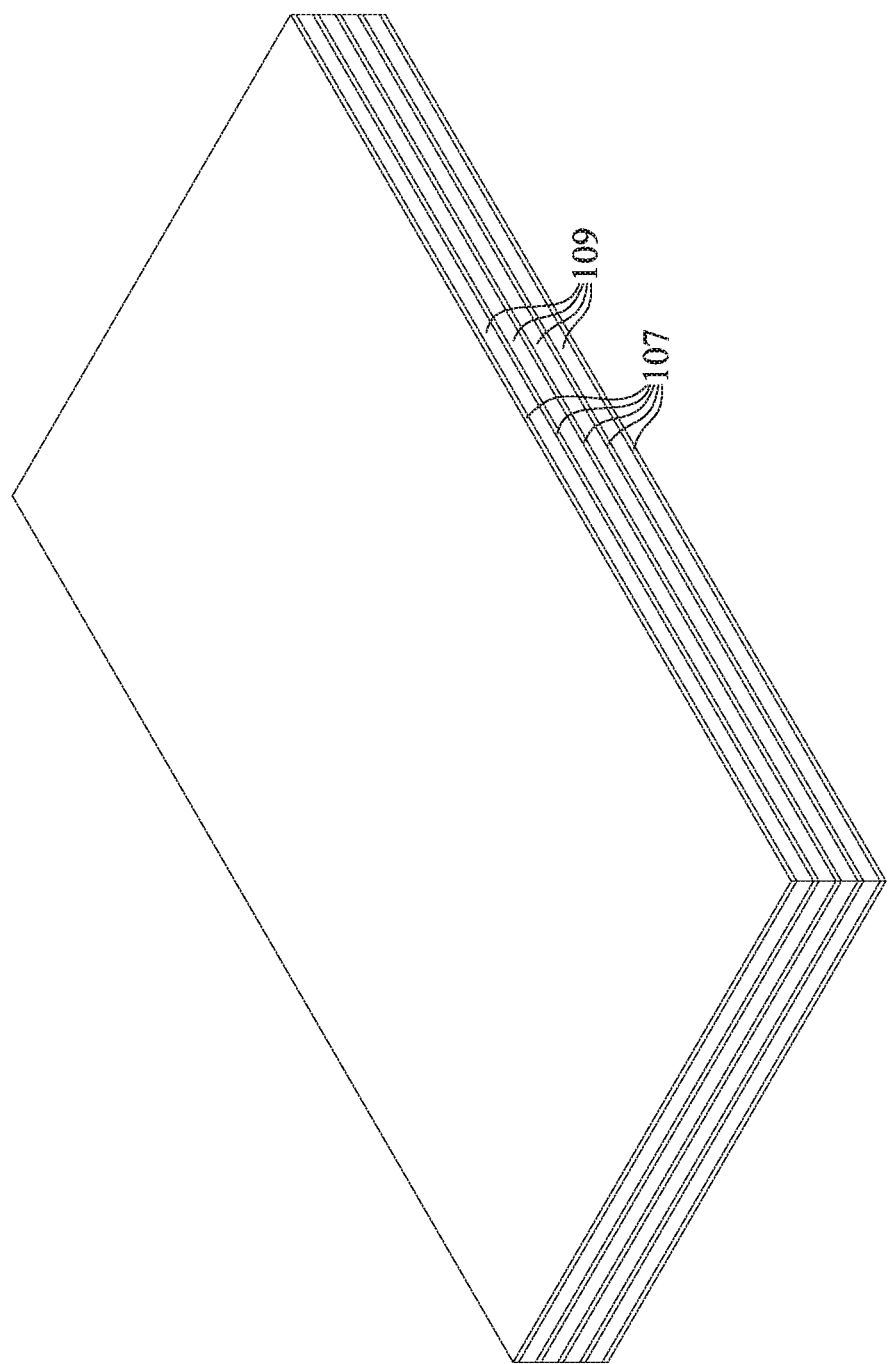
FIGS. 1-6 illustrate perspective views of a method for manufacturing a semiconductor memory device at various stages in accordance with one embodiment of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Reference is made to FIGS. 1-6, which illustrate perspective views of a method for manufacturing a semiconductor memory device at various stages in accordance with some embodiments of the present disclosure. A semiconductor memory device is formed by alternately depositing two different insulating layers (107, 109) over a substrate to form a multi-layer stacked structure.

In the present embodiment, the two different insulating layers (107, 109) may be silicon oxide layers and silicon nitride layers respectively. In other embodiments of the present disclosure, the two different insulating layers may be two of the dielectric materials such as silicon oxide, silicon nitride, silicon oxynitride, silicate, etc. In some embodiments of the present disclosure, the two different insulating layers (107, 109) are chosen from two dielectric materials that have a relatively strong etching resistivity and a relatively weak etching resistivity to a predetermined etchant.

Figure 2:
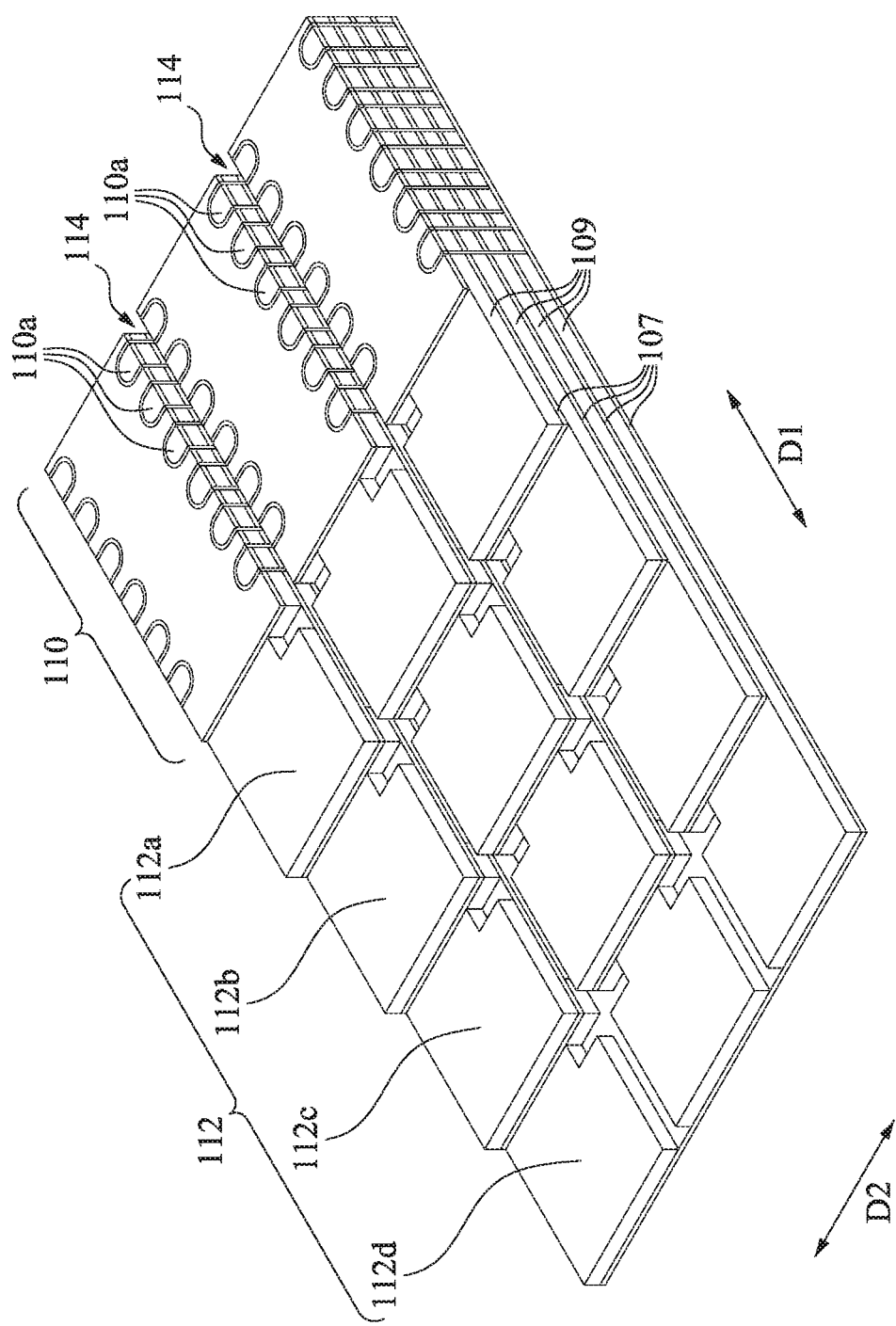

Referring to FIG. 2, the multi-layer stacked structure is etched to form a stair region 112 and a non-stair region 110. The stair region 112 includes a plurality of steps (112a-112d). Each step (112a-112d) includes an immediately-adjacent pair of two different insulating layers (107, 109).

A plurality of memory structures 110a are formed in the non-stair region 110, and each memory structure 110a passes through the two different insulating layers (107, 109) within the non-stair region 110. From a top view, each memory structure 110 may have an O-shaped, oval-shaped, ellipse-shaped or rounded rectangular circumference, but not being limited thereto.

Each memory structure 110a may include a storage layer and a channel layer. In some embodiments of the present disclosure, the storage layer may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer includes an ONO structure and the channel layer is made of poly-silicon.

An etch step is performed to form trenches 114 along a direction D1 across the stair region 112 and the non-stair region 110. The memory structures 110a crossed by the trenches 114 form hemi-cylindrical memory devices to increase the storage density.

Figure 3:
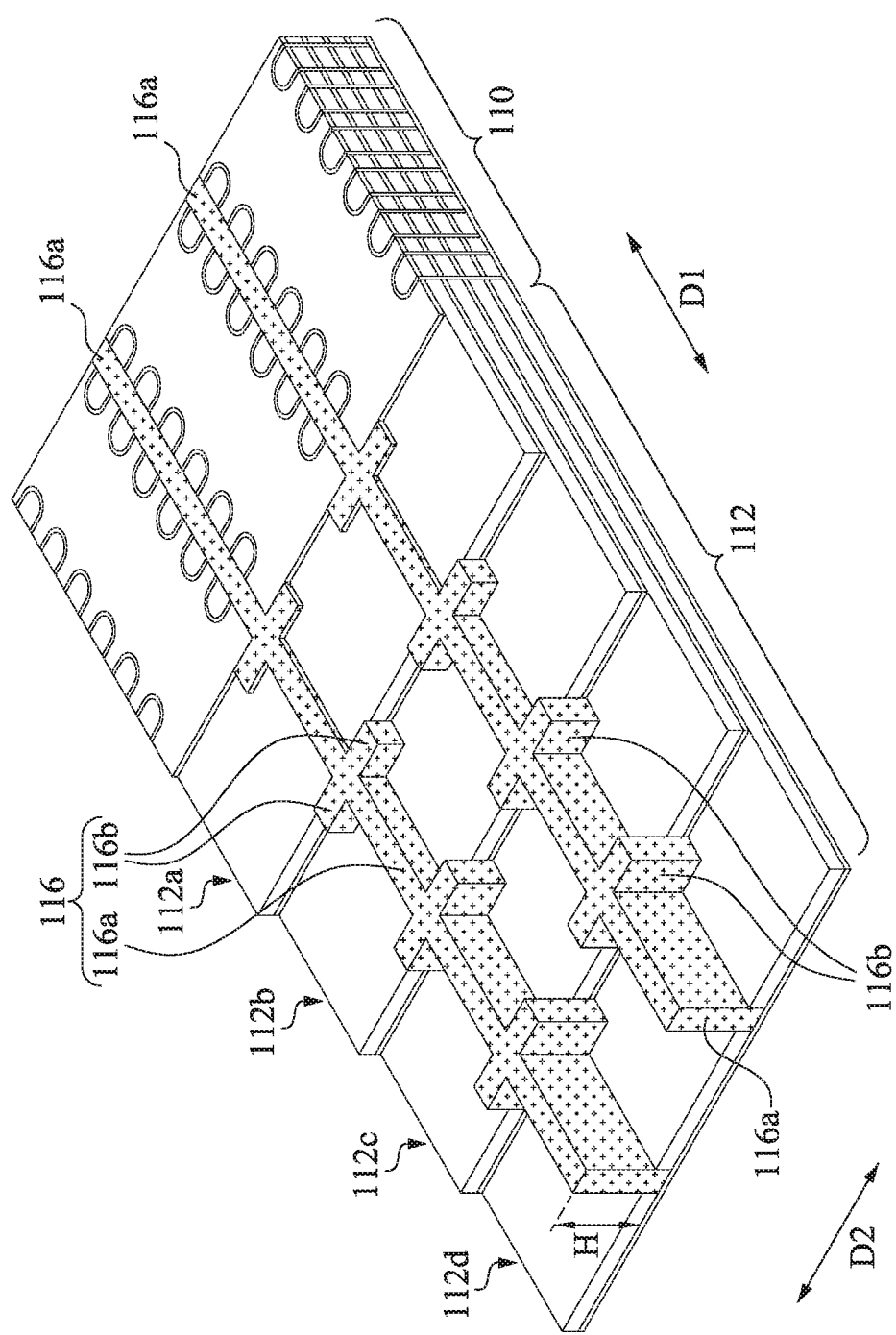

Referring to FIG. 3, a dielectric material, e.g., an oxide material, is formed within the trench 114 to form a fishbone dielectric structure 116. Each fishbone dielectric structure 116 includes a main bone 116a and a plurality of side bones 116b extending from the main bone 116a in the stair region 112. The main bone 116a also crosses the memory structures 110a in the non-stair region 110. The memory structures 110a crossed by the main bone 116a form hemi-cylindrical memory devices.

In some embodiments, the fishbone dielectric structure 116 is a dielectric structure without electrically-conductive materials, but not being limited thereto. In some embodiments, each side bone 116b extends along a sidewall of a corresponding step (112a-112d) of the stair region 112, but not being limited thereto. In some embodiments, each side bone 116b is in contact with a sidewall of a corresponding step (112a-112d) of the stair region 112, but not being limited thereto. In some embodiments, each side bone 116b extends perpendicularly from the main bone 116a, i.e., along a direction D2, but not being limited thereto. In some embodiments, an immediately-adjacent pair of the side bones 116b extends from two opposite sides of the main bone 116a, but not being limited thereto. In some embodiments, the side bones 116b symmetrically extend from the main bone 116a in the stair region 112, but not being limited thereto. In some embodiments, the main bone 116a and the side bones 116b may have substantially the same heights H in the stair region 112, but not being limited thereto. In some embodiments, the main bone 116a may have substantially the same height H in the stair region 112 and in the non-stair region 110, but not being limited thereto.

Figure 4:
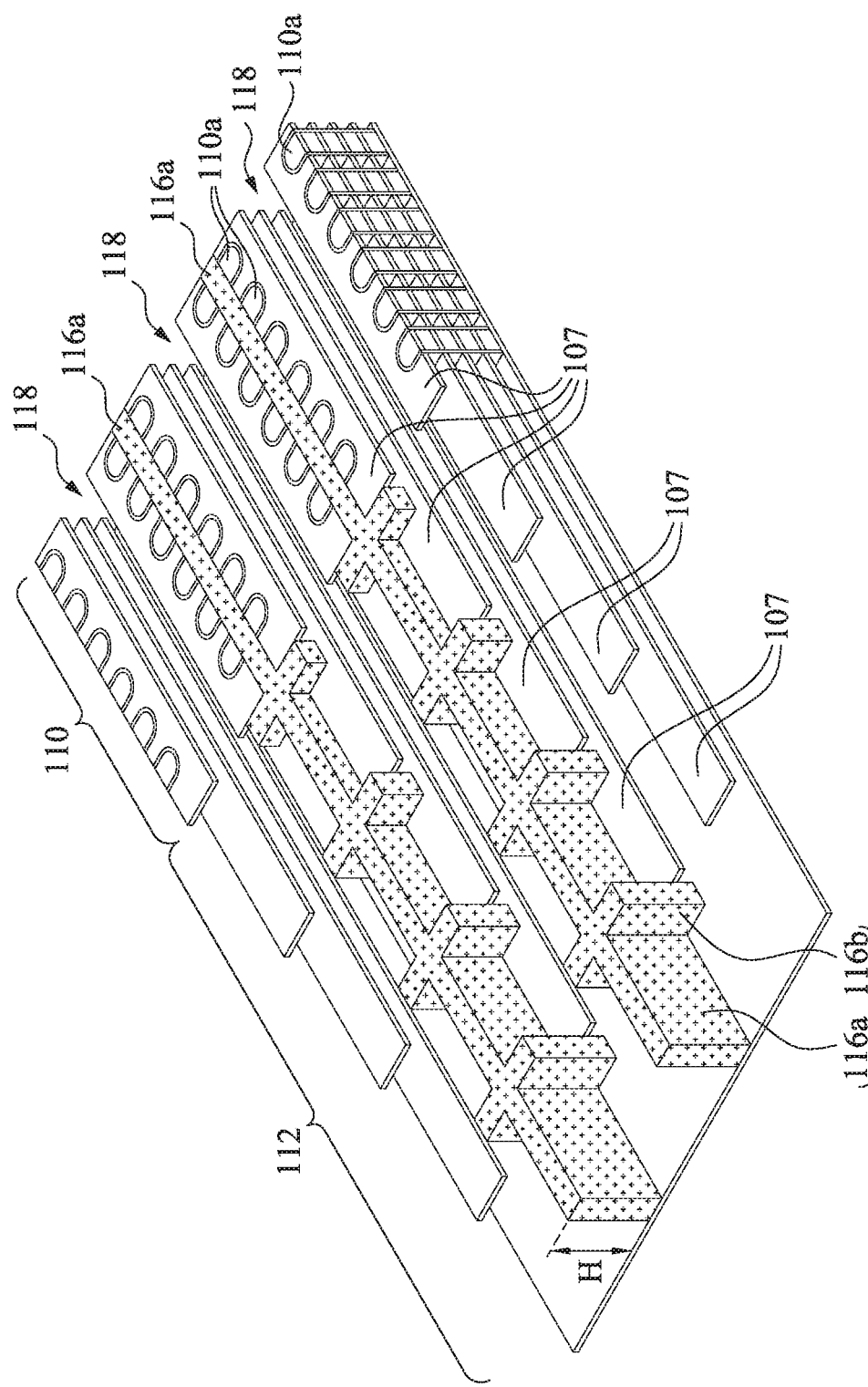

Referring to FIG. 4, an etch step is performed to form a trench 118 along the direction D1 between adjacent fishbone dielectric structures 116, and between adjacent rows of memory structures 110a in the non-stair region 110. The trench 118 is configured to be a process window for gate replacement step. A wet etching process is performed to remove the insulating layers 109 of the multi-layer stacked structure until the sidewalls of the memory structures 110a are exposed. The wet etching process is performed by filling an etchant that has a much faster etch rate to the insulating layers 109 than to the insulating layers 107 such that all the insulating layers 109 between the insulating layers 107 will be almost removed so as to form voids between the remaining (not being etched) insulating layers 107. The fishbone dielectric structures 116 serve as support structures to retain the remaining insulating layers 107 such that the insulating layers 107 would not collapse due to the voids therebetween.

Figure 5:
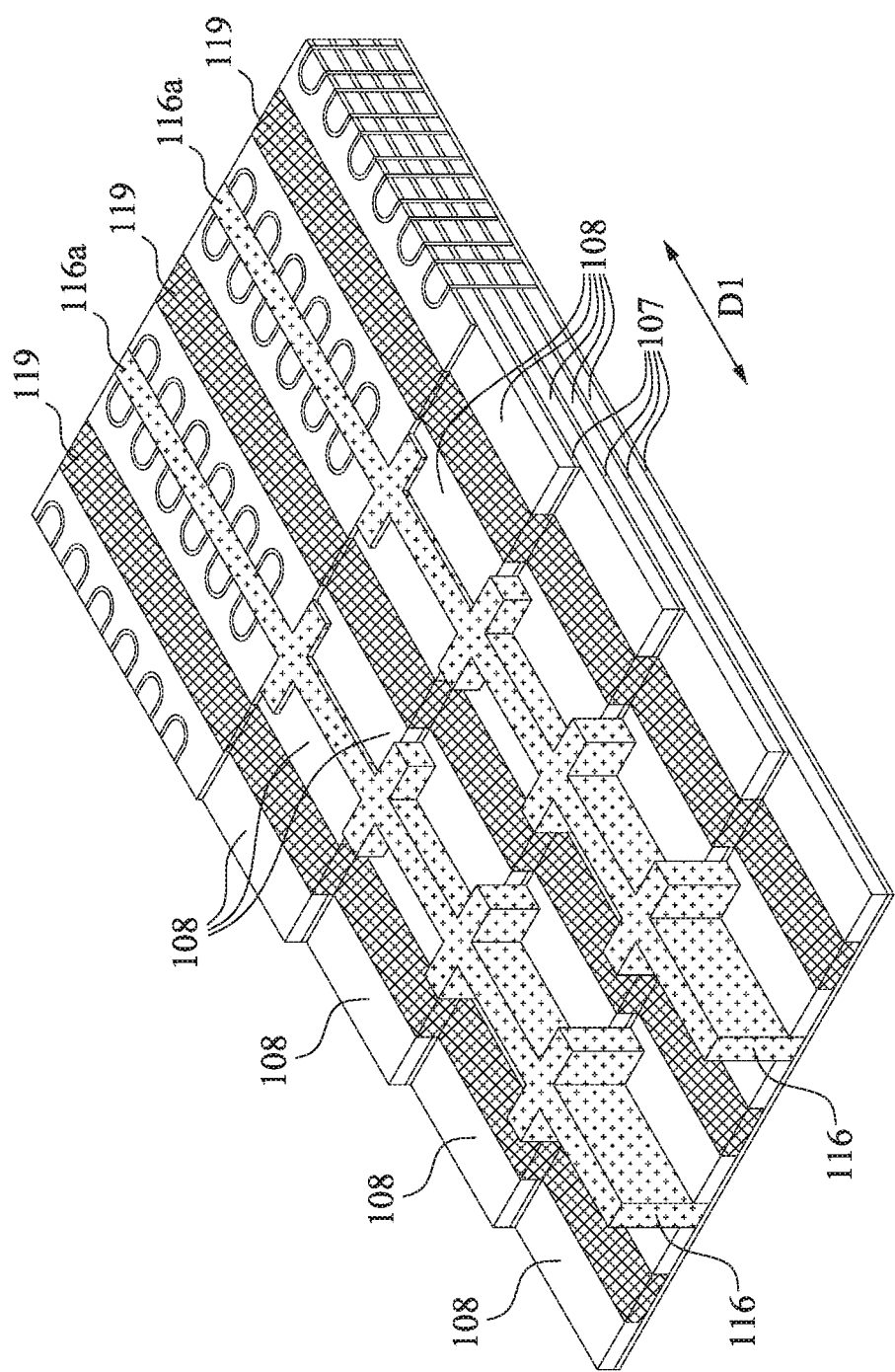

Referring to FIG. 5, a conductive material is deposited via the trenches 118 to form conductive layers 108 to fill into the voids between the remaining (not being etched) insulating layers 107. Each conductive layer 108 should reach or contact the exposed sidewalls of the memory structures 110a. The conductive material may include metals, such as Cu, Al, W or the metal alloys thereof. An etching process is performed to remove excess conductive materials to space adjacent conductive layers 108 from one another to prevent from bridging between adjacent conductive layers 108. Thereafter, dielectric walls 119 are formed along the direction D1 by depositing dielectric materials into the trenches 118 to be located between adjacent fishbone dielectric structures 116, and between adjacent rows of memory structures 110a in the non-stair region 110. After the gate replacement process, i.e., the insulating layers 109 are replaced by the conductive layers 108, the multi-layer stacked structure includes alternately-stacked insulating layers 107 and conductive layers 108, and each step (112a-112d) includes an immediately-adjacent pair of the alternately-stacked insulating layers 107 and conductive layers 108. In some embodiments, the conductive layers 108 are made from tungsten and the insulating layers 107 are made from silicon oxide.

Figure 6:
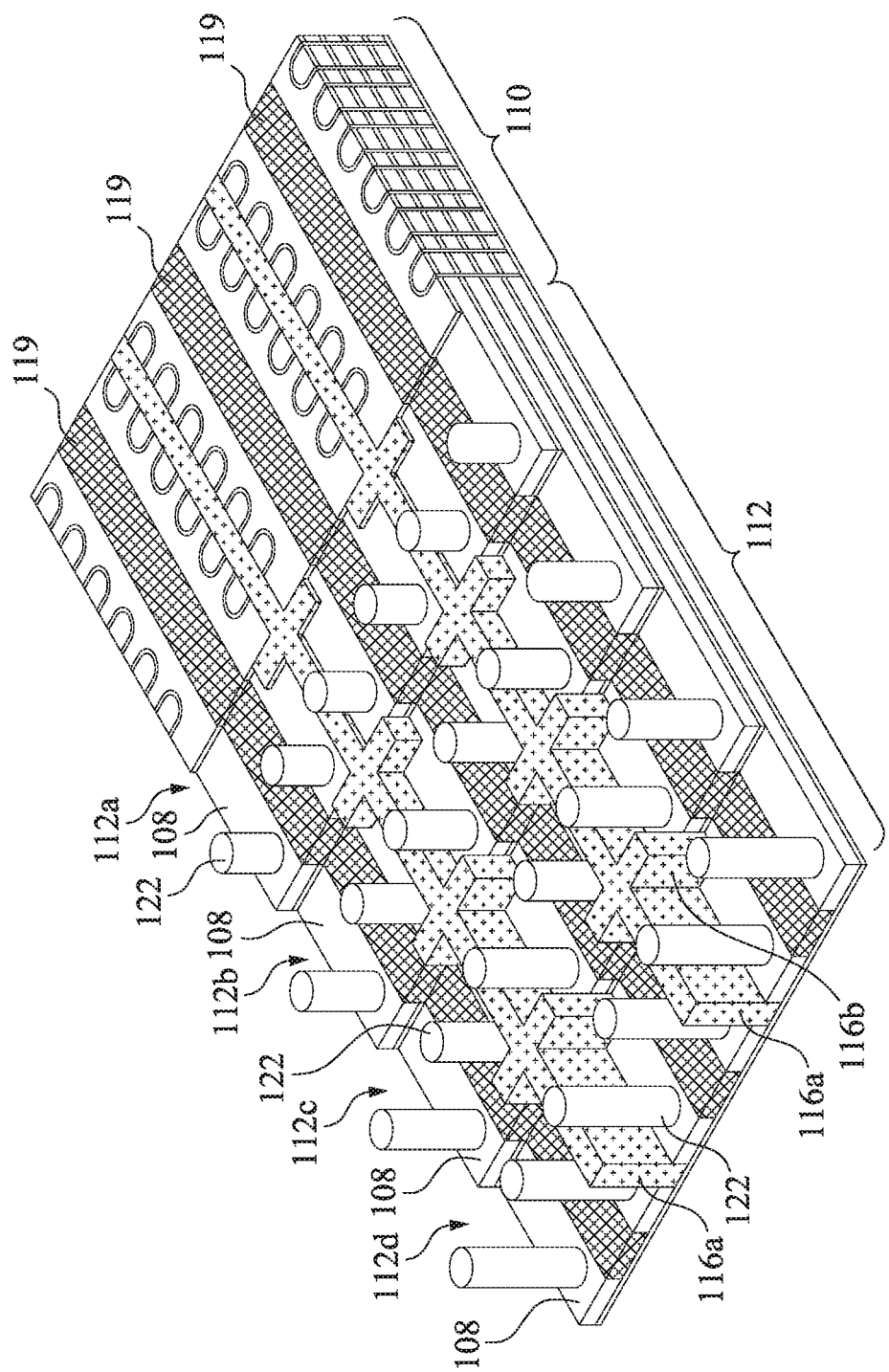

Referring to FIG. 6, a plurality of metal posts 122 are formed in contact with the steps (112a-112d) of the stair region 112. Each metal post 122 is in contact with the conductive layer 108 of each step (112a-112d). In some embodiments, an immediately-adjacent pair of the metal posts 122 are spaced from each other by a corresponding one of the side bones 116b. In some embodiments, an immediately-adjacent pair of the metal posts 122 are spaced from each other by a corresponding main bone 116a. In some embodiments, each metal post 122 is located in a region surrounded by corresponding main bone 116a, two side bones 116b and dielectric wall 119. Therefore, immediately-adjacent metal posts 122 are not easily bridged in cases of overlap shift occurred in adjacent metal post and main bone, side bones or dielectric wall.

In FIGS. 2-6, the stair region 112 is actually covered by a passivation layer, which is omitted in the drawings in order to clearly show details of the stair region 112. The metal posts 122 and the fishbone dielectric structures 116 are embedded in the passivation layer.

Figure 7:
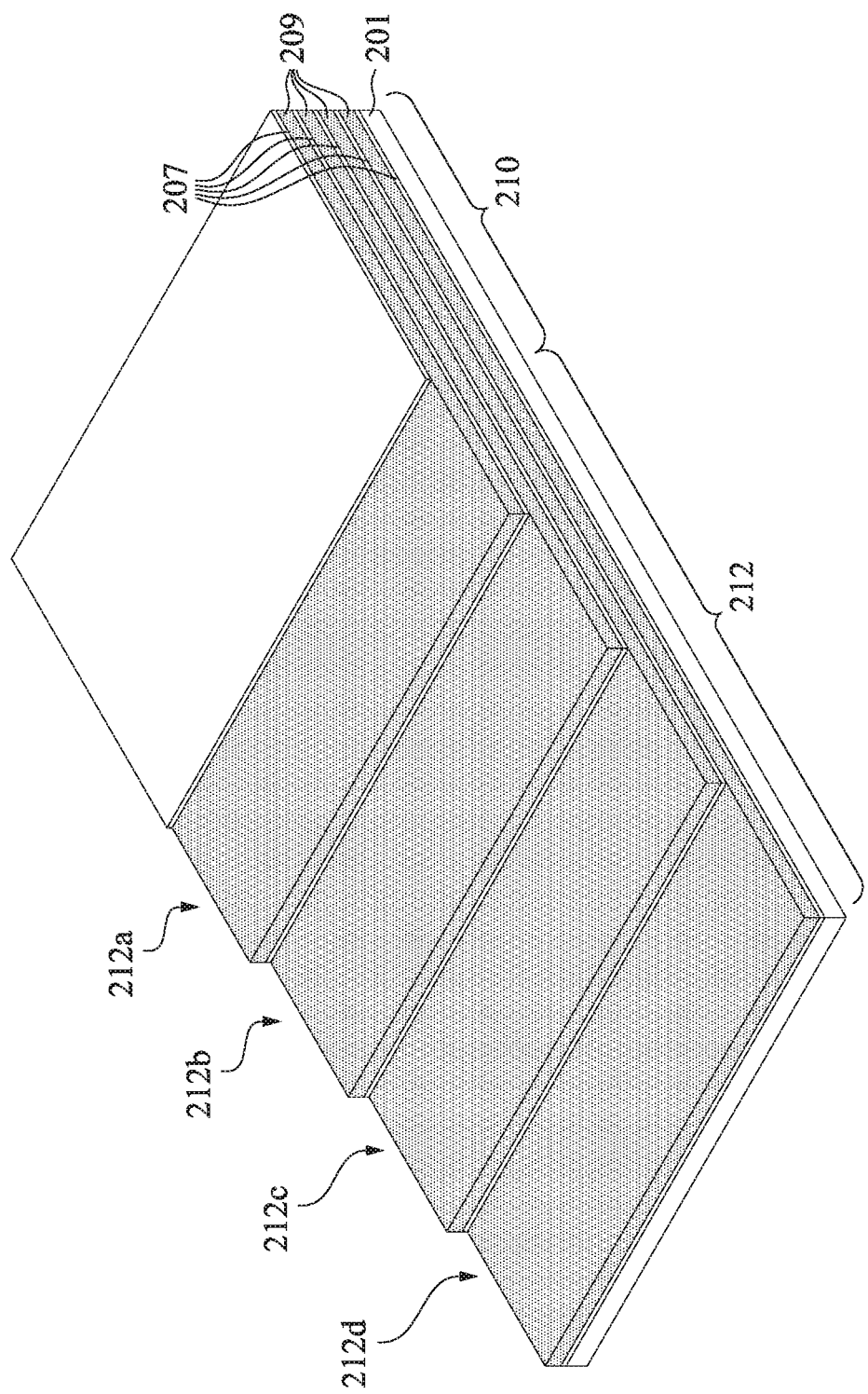
FIGS. 7-15 illustrate perspective views of a method for manufacturing a semiconductor memory device at various stages in accordance with another embodiment of the present disclosure.

Reference is made to FIGS. 7-15, which illustrate perspective views of a method for manufacturing a semiconductor memory device at various stages in accordance with some embodiments of the present disclosure. In FIG. 7, a multi-layer stacked structure includes alternately-stacked insulating layers (207, 209) over a substrate 201. The multi-layer stacked structure is etched to form a stair region 212 and a non-stair region 210. The stair region 212 includes a plurality of steps (212a-212d). Each step (212a-212d) includes an immediately-adjacent pair of two different insulating layers (207, 209).

Similarly, the two different insulating layers (207, 209) may be silicon oxide layers and silicon nitride layers respectively. In other embodiments of the present disclosure, the two different insulating layers may be two of the dielectric materials such as silicon oxide, silicon nitride, silicon oxynitride, silicate, etc. In some embodiments of the present disclosure, the two different insulating layers (207, 209) are chosen from two dielectric materials that have a relatively strong etching resistivity and a relatively weak etching resistivity to a predetermined etchant.

Figure 8:
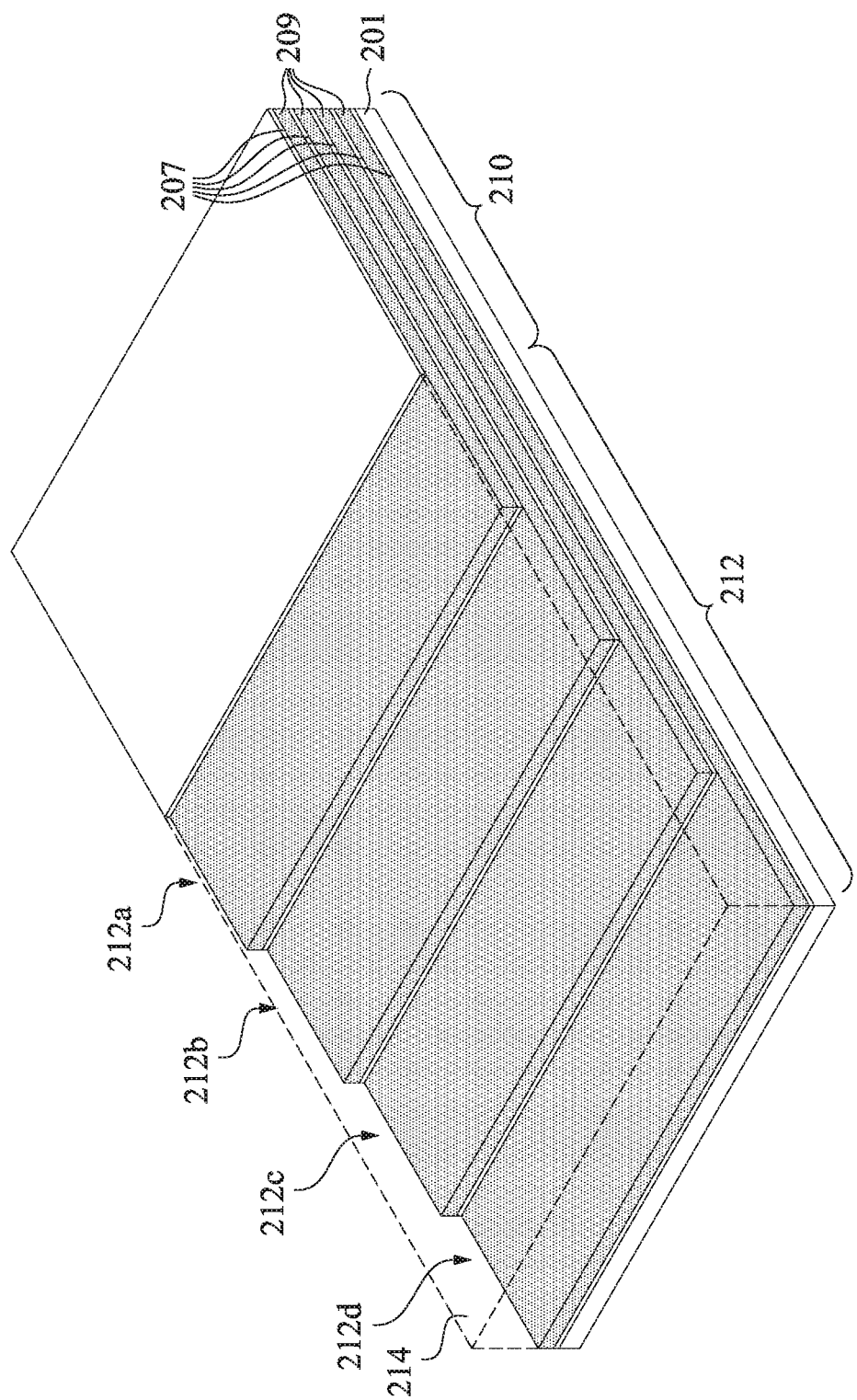

In FIG. 8, a passivation layer 214 is deposited to cover the stair region 212.

Figure 9:
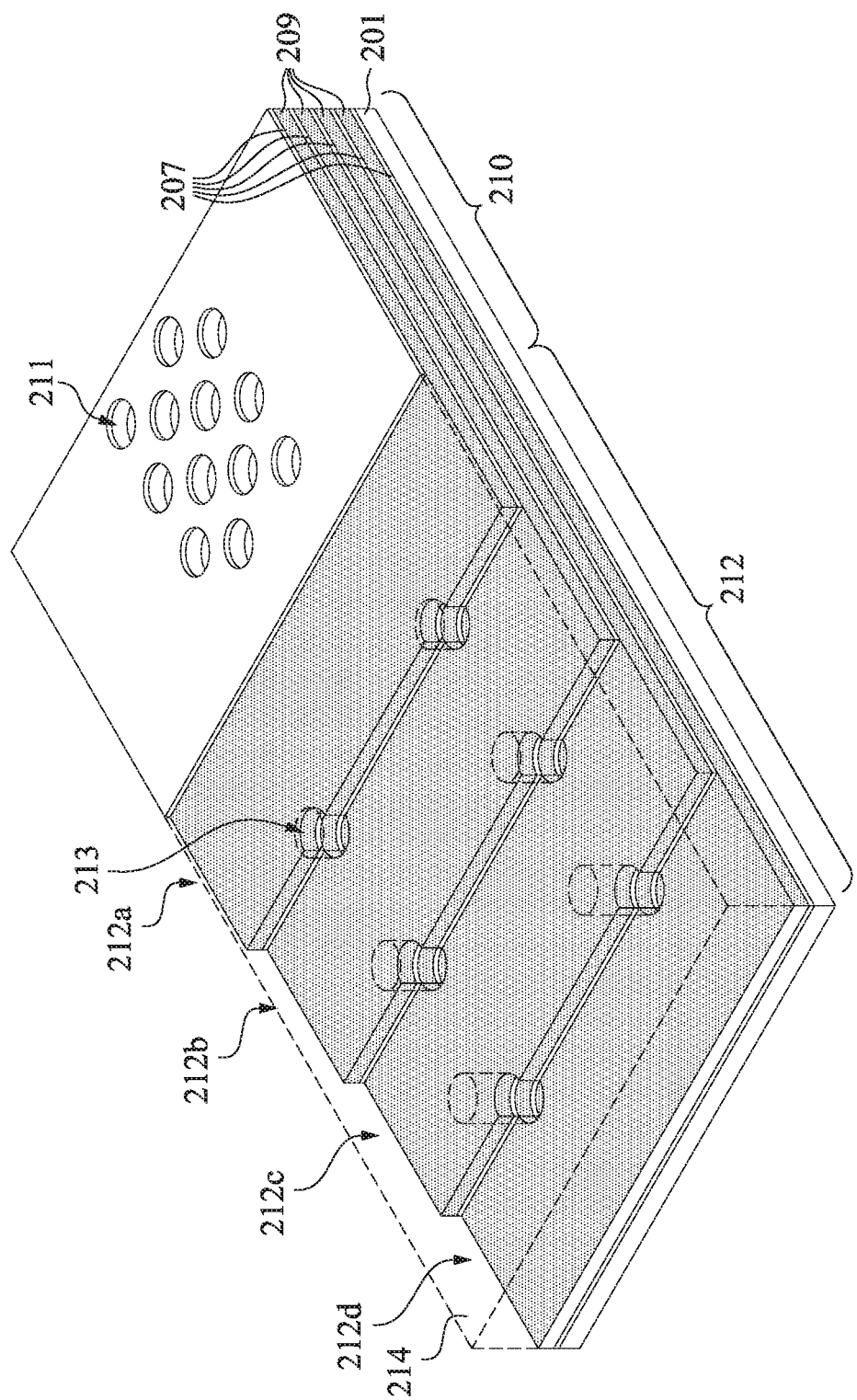

In FIG. 9, an etch process is perform to form vertical holes 211 in non-stair region 210 and vertical holes 213 in the stair region 212. In some embodiments, the vertical holes 213 are located along side walls of each step (212a-212d), but not limited thereto.

Figure 10:
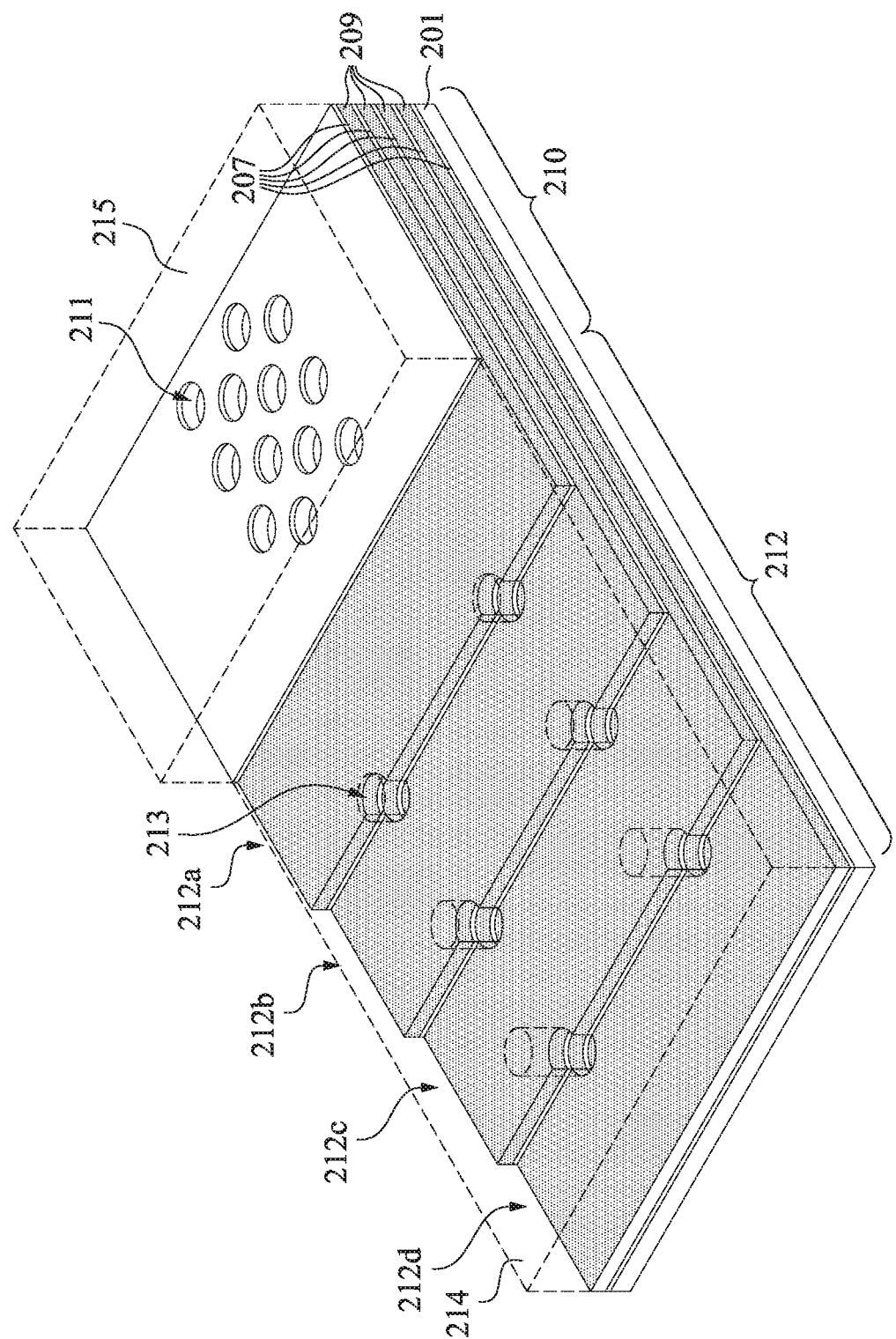

In FIG. 10, a mask layer 215 is formed over the non-stair region 210 to cover the vertical holes 211.

Figure 11:
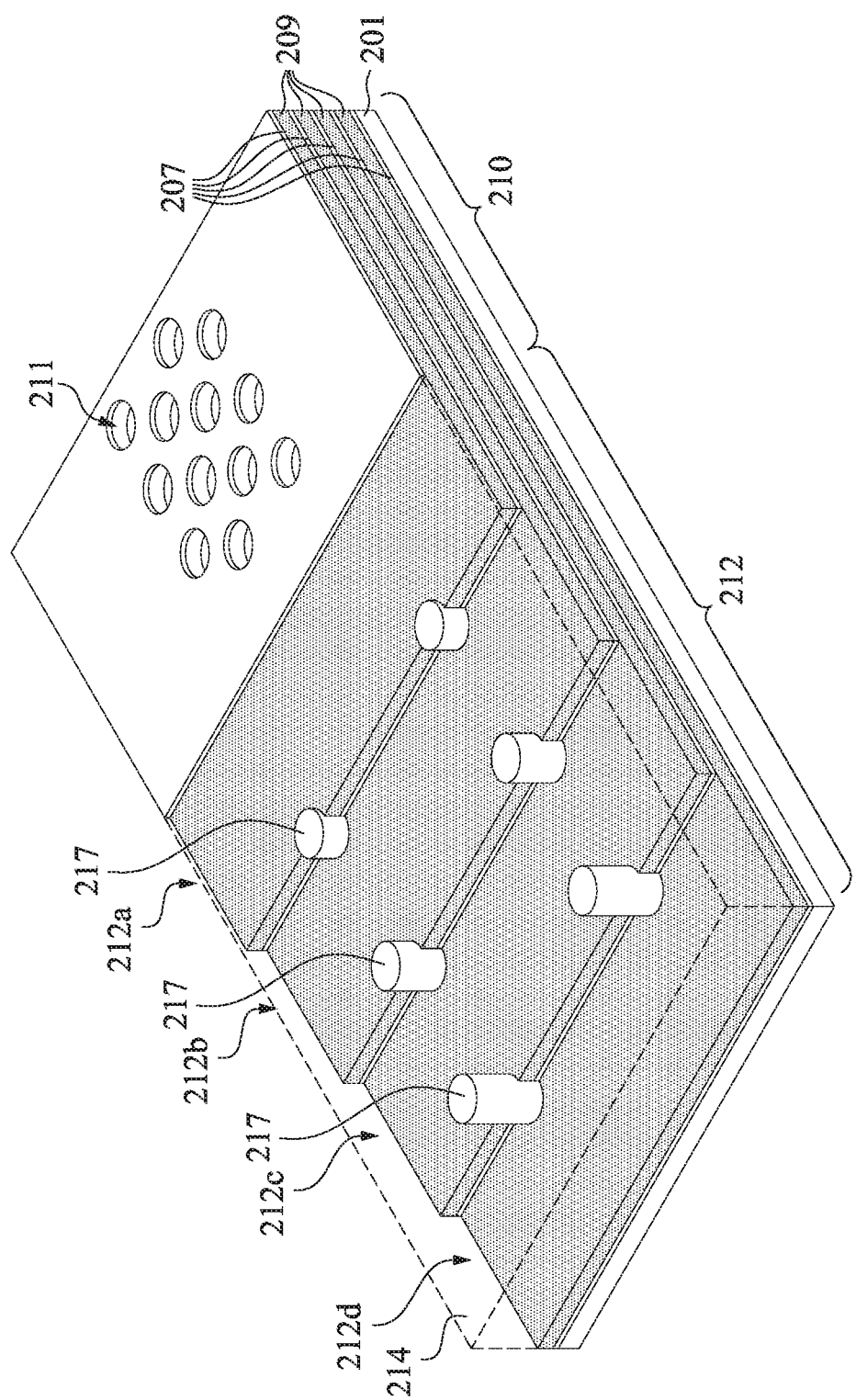

In FIG. 11, dielectric posts 217 are formed within the vertical holes 213 and the mask layer 215 is removed. In some embodiments, the dielectric posts 217 are made from a dielectric material, e.g., oxide material, containing no electrically-conductive material, but not limited thereto. In some embodiments, the dielectric posts 217 are in contact with the sidewalls of corresponding steps (212a-212d).

Figure 12:
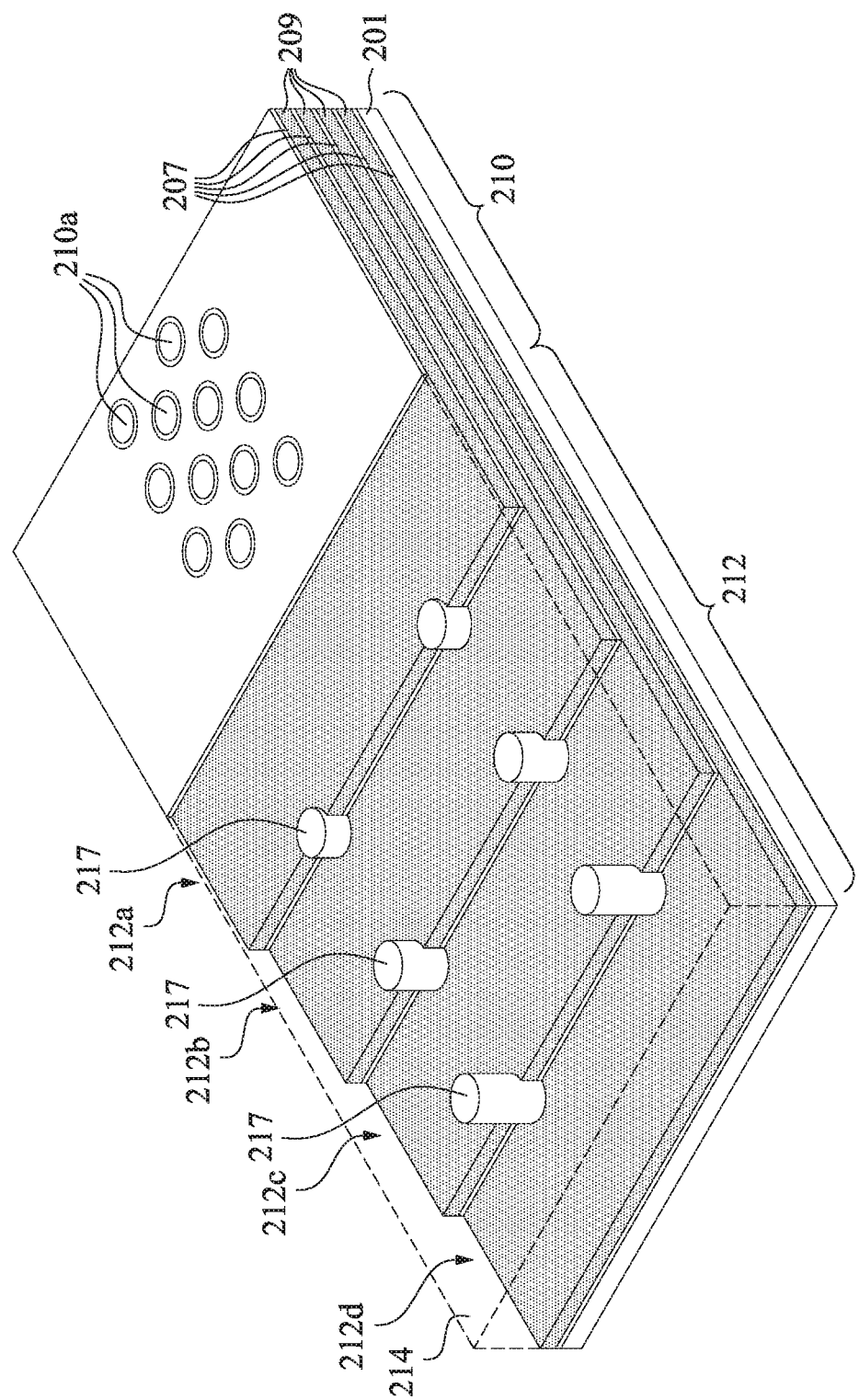

In FIG. 12, memory structures 210a are formed within the vertical holes 211 in non-stair region 210. Each memory structure 210a is different from the memory structure 110a in that the memory structure 210a is not crossed by a dielectric structure such that gate-all-around transistors are formed within the memory structure 210a.

Each memory structure 210a may include a storage layer and a channel layer. In some embodiments of the present disclosure, the storage layer may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer includes an ONO structure and the channel layer is made of poly-silicon.

Figure 13:
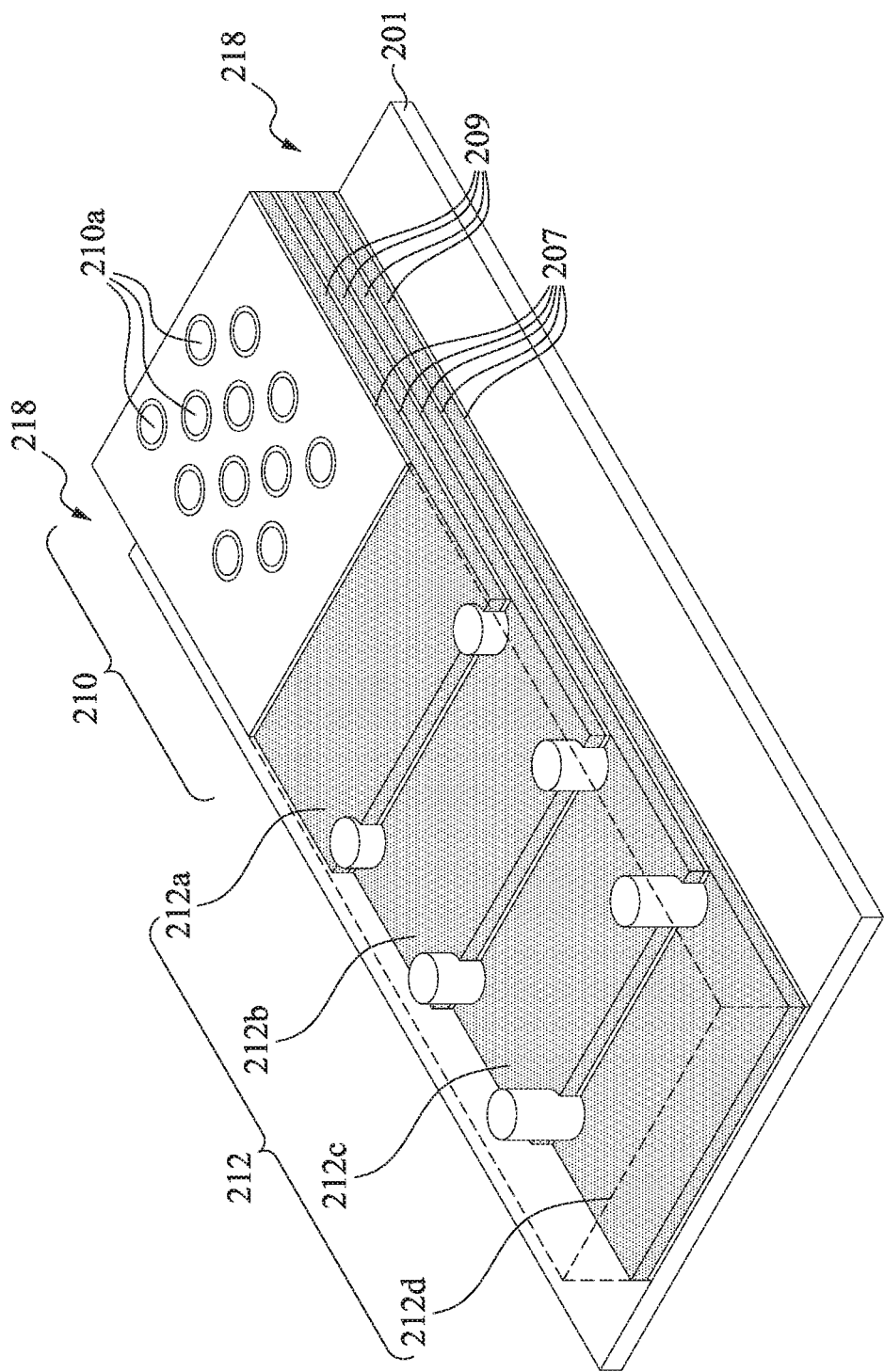

In FIG. 13, trenches 218 are etched to be a process window for gate replacement step. A wet etching process is performed to remove the insulating layers 209 of the multi-layer stacked structure until the sidewalls of the memory structures 210a are exposed. The wet etching process is performed by filling an etchant that has a much faster etch rate to the insulating layers 209 than to the insulating layers 207 such that all the insulating layers 209 between the insulating layers 207 will be almost removed so as to form voids between the remaining (not being etched) insulating layers 207. The dielectric posts 217 serve as support structures to retain the remaining insulating layers 207 such that the insulating layers 207 would not collapse due to the voids therebetween.

Figure 14:
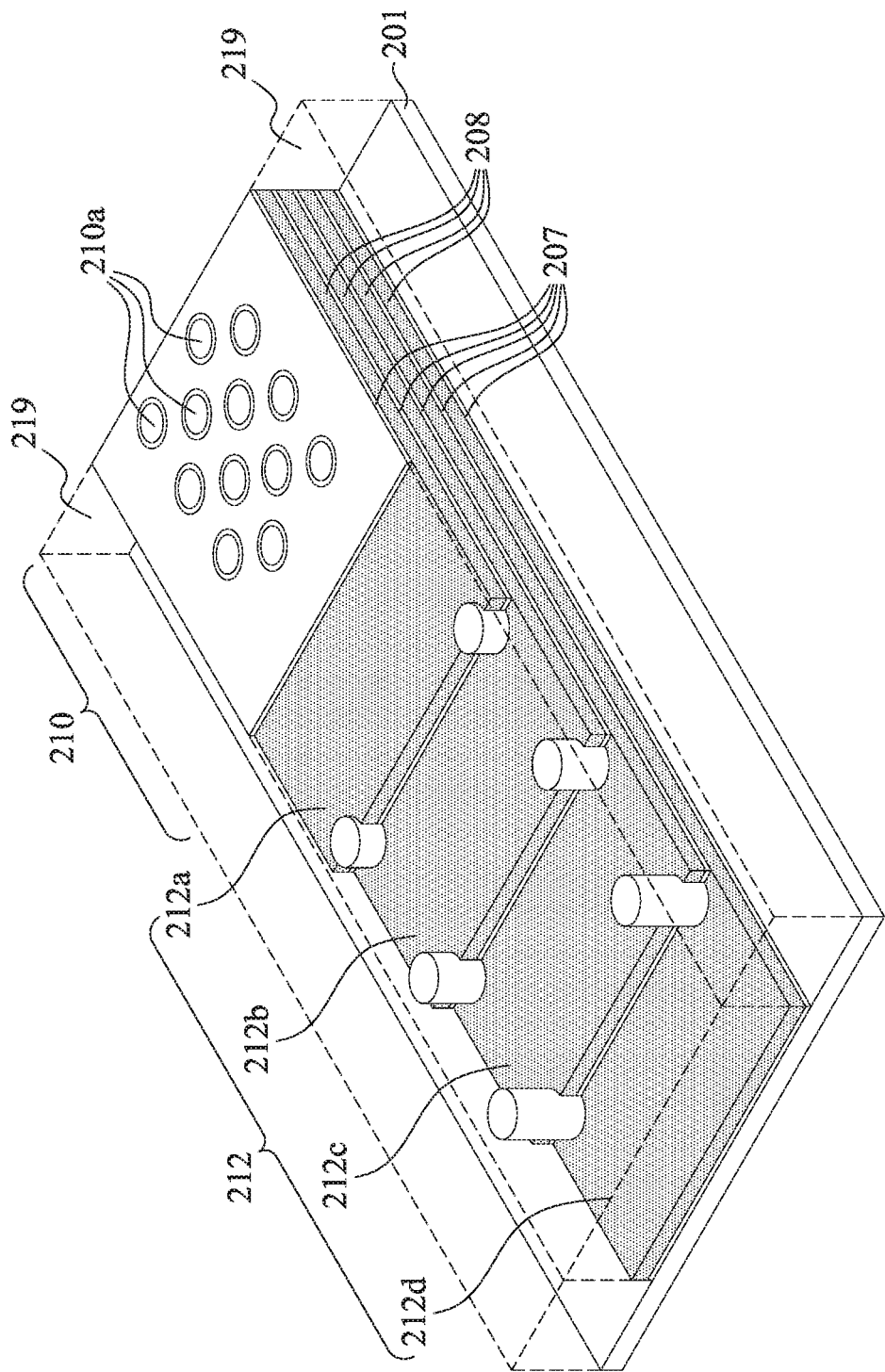

In FIG. 14, a conductive material is deposited via the trenches 218 to form conductive layers 108 to fill into the voids between the remaining (not being etched) insulating layers 207. Each conductive layer 208 should reach or contact the exposed sidewalls of the memory structures 210a. The conductive material may include metals, such as Cu, Al, W or the metal alloys thereof. An etching process is performed to remove excess conductive materials to space adjacent conductive layers 208 from one another to prevent from bridging between adjacent conductive layers 208. Thereafter, dielectric walls 219 are formed by depositing dielectric materials into the trenches 218. After the gate replacement process, i.e., the insulating layers 209 are replaced by the conductive layers 208, the multi-layer stacked structure includes alternately-stacked insulating layers 207 and conductive layers 208 and each step (212a-212d) includes an immediately-adjacent pair of the alternately-stacked insulating layers 207 and conductive layers 208. In some embodiments, the conductive layers 208 are made from tungsten and the insulating layers 207 are made from silicon oxide, but not being limited thereto.

Figure 15:
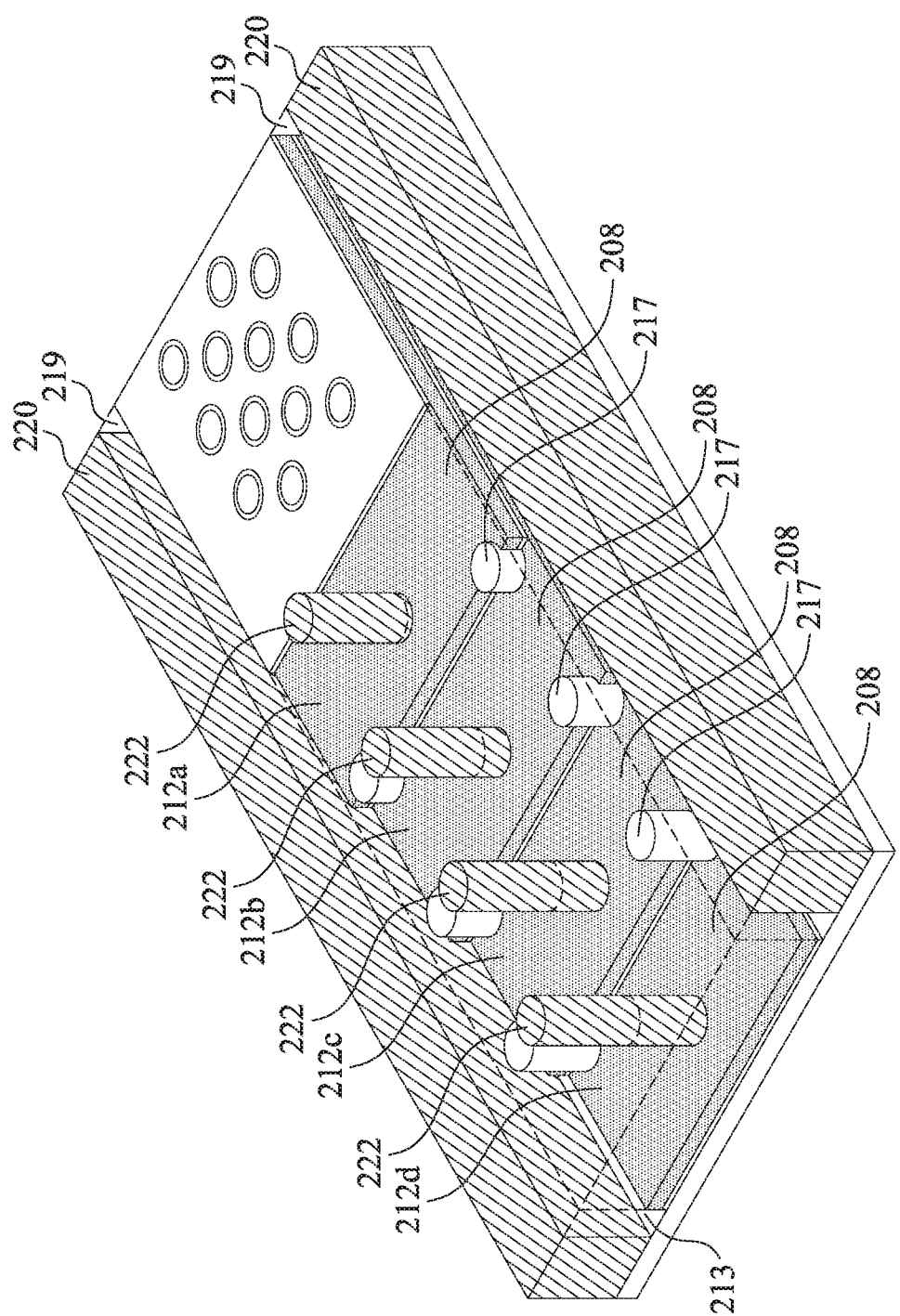

In FIG. 15, a plurality of metal posts 222 are formed in contact with the steps (212a-212d) of the stair region 212. Common source lines 220 are also formed in contact with the substrate 201. Each metal post 222 is in contact with the conductive layer 208 of each step (212a-212d). In some embodiments, each metal post 222 is located in a central region of each step (212a-212d), but not being limited thereto. In some embodiments, a corresponding dielectric post 217 is located between an immediately-adjacent pair of the metal posts 222, but not being limited thereto. Therefore, immediately-adjacent metal posts 222 are not easily bridged in cases of overlap shift occurred in adjacent metal posts.

According to aforementioned embodiments, a three-dimensional semiconductor memory device includes dielectric posts or fishbone dielectric structures in the stair regions. The dielectric posts or fishbone dielectric structures are configured to serve as support structures to retain the remaining insulating layers such that the insulating layers would not collapse due to the voids therebetween. The dielectric posts or fishbone dielectric structures are also located between metal posts or contacts in the stair regions to avoid bridging in cases of overlap shift occurred in metal posts or contacts.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A three-dimensional (3D) memory device, comprising:
a plurality of conductive layers and insulating layers alternately formed to define a multi-layer stacked structure, wherein the multi-layer stacked structure comprises a stair region and an non-stair region, the stair region comprises a plurality of steps, each step comprises an immediately-adjacent pair of the conductive layers and insulating layers;
a plurality of memory structures disposed in the non-stair region and each memory structure passing through the conductive layers and the insulating layers; and
a fishbone dielectric structure comprises a main bone and a plurality of side bones extending from the main bone in the stair region, wherein the main bone crosses the memory structures in the non-stair region.

2. The 3D memory device of claim 1, wherein the fishbone dielectric structure is a dielectric structure without electrically-conductive materials.

3. The 3D memory device of claim 1, wherein each side bone extends along a sidewall of a corresponding step of the stair region.

4. The 3D memory device of claim 1, wherein each side bone is in contact with a sidewall of a corresponding step of the stair region.

5. The 3D memory device of claim 1, further comprising a plurality of metal posts in contact with the steps of the stair region, an immediately-adjacent pair of the metal posts are spaced from each other by a corresponding one of the side bones.

6. The 3D memory device of claim 1, further comprising a plurality of metal posts in contact with the steps of the stair region, an immediately-adjacent pair of the metal posts are spaced from each other by the main bone.

7. The 3D memory device of claim 1, wherein each side bone extends perpendicularly from the main bone.

8. The 3D memory device of claim 1, wherein the fishbone dielectric structure comprises an oxide material.

9. The 3D memory device of claim 1, wherein the conductive layers comprise tungsten and the insulating layers comprise silicon oxide.

10. The 3D memory device of claim 1, wherein an immediately-adjacent pair of the side bones extends from two opposite sides of the main bone.

11. The 3D memory device of claim 1, wherein the memory structures crossed by the main bone form hemi-cylindrical memory devices.

12. The 3D memory device of claim 1, wherein the side bones symmetrically extending from the main bone in the stair region.

13. A three-dimensional (3D) memory device, comprising:
a plurality of conductive layers and insulating layers alternately formed to define a multi-layer stacked structure, wherein the multi-layer stacked structure comprises a stair region and an non-stair region, the stair region comprises a plurality of steps, each step comprises an immediately-adjacent pair of the conductive layers and insulating layers;
a plurality of memory structures disposed in the non-stair region and each memory structure passing through the conductive layers and the insulating layers; and
at least one dielectric post disposed in each step of the stair region, wherein the at least one dielectric post is a dielectric post without electrically-conductive materials, wherein the at least one dielectric post is in contact with an exposed sidewall of each step.

14. The 3D memory device of claim 13, further comprising a plurality of metal posts in contact with the steps of the stair region, the at least one dielectric post is disposed between an immediately-adjacent pair of the metal posts.

15. The 3D memory device of claim 13, further comprising a plurality of metal posts in contact with the steps of the stair region, each metal post is located in a central region of each step.

16. The 3D memory device of claim 13, wherein the at least one dielectric post comprises an oxide material.

17. The 3D memory device of claim 13, wherein the conductive layers comprise tungsten and the insulating layers comprise silicon oxide.

18. The 3D memory device of claim 13, wherein each of the memory structures comprises gate-all-around transistors.

19. The 3D memory device of claim 13, further comprising a passivation layer covered over the stair region.

* * * * *